United States Patent [19]

Bailey et al.

[11] Patent Number: 5,309,295
[45] Date of Patent: May 3, 1994

[54] METHOD AND APPARATUS FOR BIASING A MAGNETO-RESISTIVE HEAD

[75] Inventors: James A. Bailey; Paul H. Francois, both of Tucson, Ariz.

[73] Assignee: International Business Machines Corporation, Armonk, N.Y.

[21] Appl. No.: 957,858

[22] Filed: Oct. 8, 1992

[51] Int. Cl.$^5$ .......................... G11B 5/03; G11B 5/09; G11B 5/02

[52] U.S. Cl. ....................... 360/66; 360/46; 360/67

[58] Field of Search ............... 360/70.1, 70.2, 77.3, 360/77.4, 113, 46, 65, 66, 67, 68, 63; 330/291, 293, 104, 112

[56] References Cited

U.S. PATENT DOCUMENTS

| | | | |
|---|---|---|---|
| 4,041,538 | 8/1977 | Parker | 360/66 X |
| 4,050,086 | 9/1977 | Harr | 360/66 |
| 4,191,977 | 3/1980 | Lewkowicz | 360/66 |
| 4,492,997 | 1/1985 | Arai et al. | 360/113 |
| 4,680,657 | 7/1987 | Naito | 360/111 |
| 4,691,259 | 9/1987 | Imakoshi et al. | 360/113 |
| 4,706,138 | 11/1987 | Jove et al. | 360/67 |
| 4,712,144 | 12/1987 | Klaassen | 360/67 |
| 4,716,306 | 12/1987 | Sato et al. | 307/296 |
| 4,786,993 | 11/1988 | Jove et al. | 360/67 |
| 4,879,610 | 11/1989 | Jove et al. | 360/67 |
| 5,103,353 | 4/1992 | Jove et al. | 360/67 |
| 5,132,852 | 7/1992 | Price, Jr. | 360/68 X |
| 5,204,789 | 4/1993 | Jove et al. | 360/113 X |

FOREIGN PATENT DOCUMENTS 189804 11/1983 Japan ..................... 360/67

OTHER PUBLICATIONS

IBM Tech. Discl. Bulletin, Apr. 1984 "Improved Method for Brasing a Magnetoresistive Element", Baily & Ramirez, vol. 26, No. 11, p. 5915.

Primary Examiner—Donald Hajec
Assistant Examiner—Le Thien Minh
Attorney, Agent, or Firm—D. A. Shifrin

[57] ABSTRACT

A method and apparatus are provided for biasing a non-center tapped magneto-resistive head at a constant voltage using two separate biasing stages to provide independent control over the voltage at each of the two terminals of the head. A first control device detects the voltage at a first head terminal and directs changes to the output of a current source, interconnected with a first terminal of the head, to maintain the voltage at the first terminal at a first predetermined voltage. A second control device detects the voltage at second terminal of the head and directs changes to the input of a current sink, interconnected with the second terminal, to maintain the voltage at the second terminal at a second predetermined voltage. Each control device is interconnected to a separate reference voltage source; by appropriate selection of the voltages of the reference voltage sources, the voltages at the two head terminals and the potential across the head can be established and maintained.

25 Claims, 1 Drawing Sheet

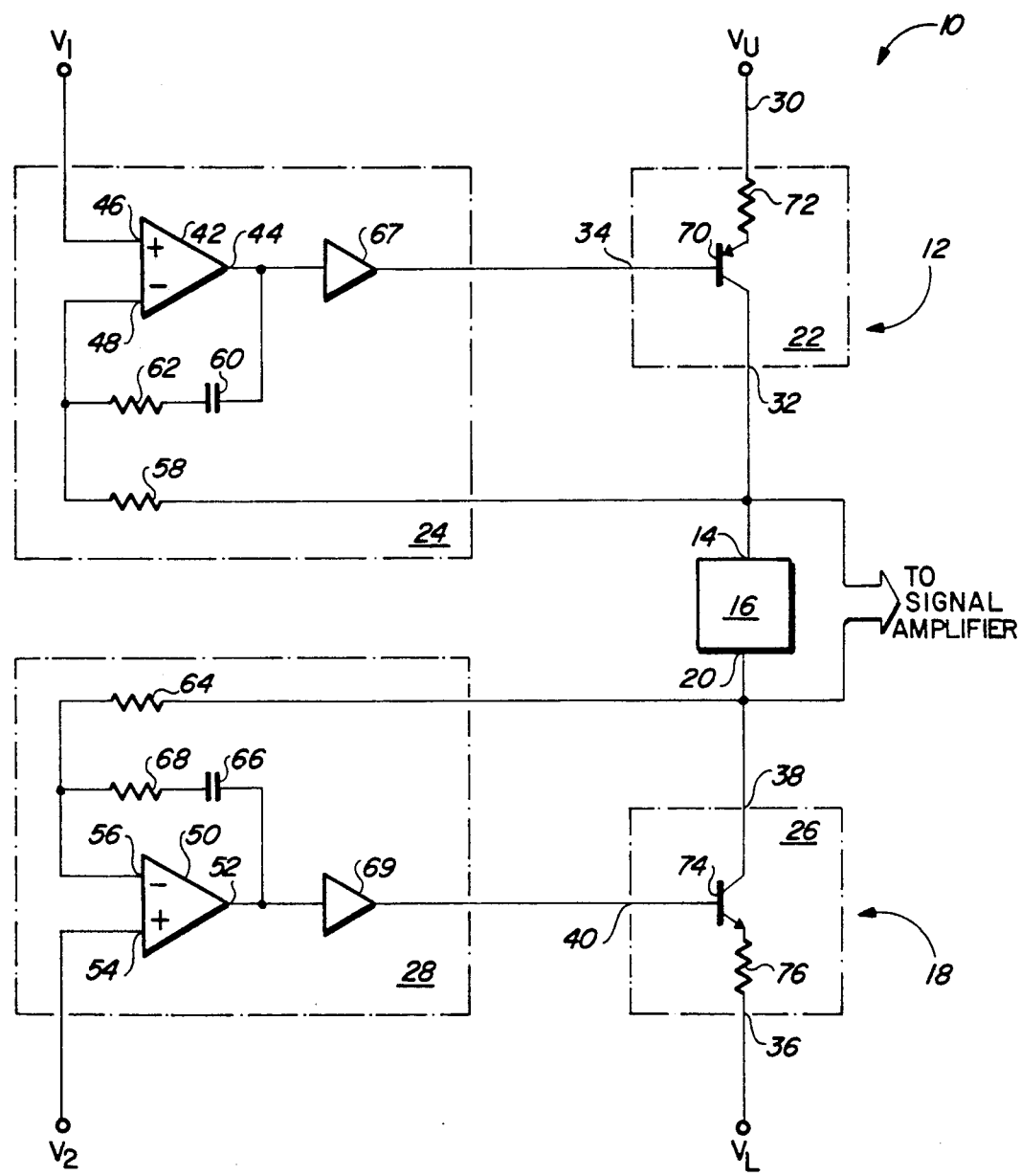

METHOD AND APPARATUS FOR BIASING A MAGNETO-RESISTIVE HEAD

TECHNICAL FIELD OF THE INVENTION

This invention relates to magneto-resistive heads and, in particular, to a method and apparatus for biasing a non-center tapped magneto-resistive head at a constant voltage.

BACKGROUND OF THE INVENTION

A magneto-resistive (MR) head, as used, for example, for reading magnetic tapes, generally comprises a thin film of a material whose resistance varies with the magnitude and direction of an external magnetic flux (such as generated by data on a magnetic tape) applied to the head. As with other types of sensors, the signals read by an MR head must be amplified. However, because of a non-linear relationship between magnitude of the external flux and the resulting resistance of the head, the head must be biased to maintain circuit operation within a linear portion of the characteristic curves of the head and the amplifier.

Older MR heads have three terminals: two outer signal terminals to provide the signals to be amplified and a center terminal connected to a ground potential to provide symmetrical biasing of the head and impedance matching of the two outer terminals. More recently, efforts to increase the amount of data which can be stored on a tape by increasing the bit density of each track and decreasing the track width to increase the number of tracks on the tape have made it necessary to reduce the size of the tape head to such an extent that the center terminal has been eliminated.

Biasing can be achieved by providing a constant current through the head to create a constant voltage potential across the two signal terminals of the head. The varying magnetic flux from the tape generates a high frequency varying voltage across the head on top of the constant bias voltage. Alternatively, a constant voltage can be provided across the head which creates a constant current through the head; the varying magnetic flux from the tape generates a high frequency varying current through the head on top of the constant bias current. With either method, the high frequency varying voltage or current across or through the head, respectively, is sensed by an amplifier which outputs useful signals representative of the information on the tape. For satisfactory operation of an MR tape head subsystem with a high signal-to-noise ratio (SNR), a high common mode rejection ratio (CMRR) and a high power supply rejection ratio (PSRR), the signal terminals of the head should have high impedance over the frequency range of operation to enable the terminals to pass a biasing signal without interference by the fast varying (high frequency) information signal from the head. Additionally, the input impedances of the signal terminals should be substantially the same despite different circuit components which may be interconnected with them.

The use of a two-terminal head has eliminated the biasing and impedance symmetry inherent with a three-terminal head. Moreover, a head can be subjected to varying operating conditions during its life, such as temperature fluctuations, and can undergo significant surface wear from contact of the moving tape with the head. For example, the resistance of a new MR head may be about 30 ohms. Due to wear, however, the resistance may slowly increase to about 120 ohms over the life of the head, a significant increase which can adversely affect the performance of a tape subsystem. And, process variations which occur during the fabrication of a batch of heads can result in small but significant variations in the initial resistance of different heads having the same nominal specifications. A single fixed-bias circuit design is not capable of compensating for the different and possibly changing biasing requirements imposed by these variations. Consequently, downtime for maintenance and early head replacement decreases the overall efficiency of a tape subsystem.

SUMMARY OF THE INVENTION

In accordance with the present invention, a method and apparatus are provided for biasing a two terminal magneto-resistive head. In particular, the present invention employs two separate and independent biasing stages, configured in series with the head, each of which senses and controls the voltage at one of the two terminals to maintain the terminal at a predetermined voltage and to maintain a predetermined DC potential across the head.

The apparatus of the present invention comprises an adjustable current source having a current output interconnected with a first terminal of a magneto-resistive head; a first control means for detecting the voltage at a first terminal of the head and for adjusting the current output of the current source whereby the voltage at the first terminal of the head is substantially maintained at a first predetermined voltage; an adjustable current sink having a current input interconnected with a second terminal of the head; and, a second control means for detecting the voltage at the second terminal of the head and for adjusting the input of the current sink whereby the voltage at the second terminal of the head is substantially maintained at a second predetermined voltage. Each control means can comprise an operational amplifier, with appropriate feedback, to determine the difference between the voltage at one of the head terminals and the respective predetermined voltage and to generate an error signal corresponding to the difference. The current source can comprise an amplifier, such as a transistor, which is responsive to the error signal from the first control means and controls the voltage at the first terminal of the MR head. Similarly, the current sink can comprise an amplifier, such as a transistor, which is responsive to the error signal from the second control means and controls the voltage at the second terminal of the MR head.

The method of the present invention comprises the steps of comparing a first operating voltage, at a first terminal of a magneto-resistive head, with a first reference voltage; adjusting the output of a current source interconnected with a first terminal of the head until the first operating voltage is substantially equal to the first reference voltage; comparing a second operating voltage, at a second terminal of the head, with a second reference voltage; and adjusting the input of a current sink interconnected with a second terminal of the head until the second operating voltage is substantially equal to the second reference voltage. Each comparing step can comprise the step of generating an error signal representative of the difference between one of the operating voltages and the respective reference signal, and each adjusting step can comprise the step of adjusting the output or input current of the current source or sink, respectively, by an amount proportional to the magnitude of the respective error signal. The method can also comprise the steps of establishing the first and second reference voltages at predetermined levels to establish a predetermined DC potential across the head substantially equal to the difference between the first and second reference voltages.

The present invention provides high impedance at each terminal of the MR head with good SNR, CMRR and PSRR. The present invention also provides a single circuit design which can accommodate different heads with different biasing specifications and can automatically compensate for different operating conditions, head wear and head fabrication process variations.

The foregoing and other features and advantages of the invention will be apparent from the following more particular description of preferred embodiments of the invention, as illustrated in the accompanying drawing.

BRIEF DESCRIPTION OF THE DRAWING

The FIGURE illustrates a schematic diagram of a biasing apparatus of the present invention.

DETAILED DESCRIPTION OF THE INVENTION

Referring to the FIGURE, the apparatus 10 of the present invention comprises an upper biasing stage 12, interconnected with an upper terminal 14 of a magnetoresistive head 16, and a lower biasing stage 18, interconnected with a lower terminal 20 of the head 16. The upper biasing stage 12 includes an adjustable current source 22, interconnected between the upper terminal 14 and an upper voltage source $V_U$, and an upper control device 24 to control the current through the current source 22; the lower biasing stage 18 includes an adjustable current sink 26, interconnected between the lower terminal 20 and a lower voltage source $V_L$, and a lower control device 28 to control the current through the current sink 26. The current source 22 includes a voltage terminal 30 interconnected with $V_U$, a current terminal 32 interconnected with the upper terminal 14 of the head 16, and a control terminal 34 for adjusting the current to be sourced by the current source 22. Similarly, the current sink 26 includes a voltage terminal 36 interconnected with $V_L$, a current terminal 38 interconnected with the lower terminal 20 of the head 16, and a control terminal 40 for adjusting the current to be sunk by the current sink 26.

Preferably, the upper control device 24 includes an operational amplifier ("op-amp") 42 having an output 44 interconnected with the control terminal 34 of the current source 22, a non-inverting input 46 interconnected with a reference voltage source $V_1$, and an inverting input 48 interconnected with the upper terminal 14 of the head 16. Similarly, the lower control device 28 preferably includes an op-amp 50 having an output 52 interconnected with the control terminal 40 of the current sink 26, a non-inverting input 54 interconnected with another reference voltage source $V_2$, and an inverting input 56 interconnected with the lower terminal 20 of the head 16.

It is further preferred that the upper and lower control devices 24 and 28 be configured as integrators, as illustrated in the FIGURE. With respect to the upper control device 24, a resistance 58 is interconnected between the inverting input 48 of the op-amp 42 and the upper terminal 14 of the head 16 and a capacitance 60 is interconnected between the inverting input 48 and the output 44 of the op-amp 42. It has been found that satisfactory stabilization of the feedback loop can be achieved when a compensating resistance 62 is interconnected in series with the capacitance 60. Similarly, with respect to the lower control device 28, a resistance 64 is interconnected between the inverting input 56 of the op-amp 50 and the lower terminal 20 of the head 16 and a capacitance 66 is interconnected between the inverting input 56 and the output 52 of the op-amp 50. A compensating resistance 68 is interconnected in series with the capacitance 66 for satisfactory stabilization of the feedback loop. Additionally, for satisfactory feedback, an inverter 67 should be interconnected between the output 44 of the op-amp 42 and the control terminal 34 of the current source 22, and an inverter 69 should be interconnected between the output 52 of the op-amp 50 and the control terminal 40 of the current sink 26.

Although a practical current source or sink would comprise many transistors and other circuit elements in any of several configurations, a single-transistor representation of the current source 22 and sink 26 is discussed herein and shown in the FIGURE for illustrative purposes only. Thus, the current source 22 is represented in the FIGURE as a p-type transistor 70 with a resistance 72 interconnected between the emitter of the transistor 70 and the voltage terminal 30. The base of the transistor 70 is interconnected with the control terminal 34 of the current source 22. In a like manner, the current sink 26 is represented in the FIGURE as an n-type transistor 74 with a resistance 76 interconnected between the emitter of the transistor 74 and the voltage terminal 36. The base of the transistor 74 is interconnected with the control input 40 of the current sink 26.

The operation of the present invention will now be described with particular reference to the upper biasing stage 12 but the description applies as well to the lower biasing stage 18. The op-amp 42 senses the voltage at the upper terminal 14 and the voltage $V_1$ and adjusts the voltage of the output 44 in an attempt, through the feedback loop, to adjust the voltage at the upper terminal 14 to equal the voltage $V_1$ at the non-inverting input 46. A small voltage change at the output 44 (and the control terminal 34 of the current source 22) translates into a larger current change through the current source 22. And, due to the impedance of the current source 22, the current change causes the voltage at the current terminal 32 (and at the upper terminal 14 of the head 16) to vary.

Thus, by appropriate selection of both $V_1$ and $V_2$, desired voltages at the upper and lower terminals 14 and 20 of the head 16, and a desired DC potential $V_1-V_2$ across the head 16, can be established and automatically maintained. For example, in certain applications, the upper terminal 14 should be at a level below ground potential, such as about $-0.7$ V, to reduce galvanic corrosion caused by tape-to-head contact, and the DC potential across the head 16 should be about 1.0 V to establish a satisfactory biasing current. Consequently, $V_1$ would be set to $-0.7$ V and $V_2$ would be set to $-1.7$ V. The feedback enables the selected biasing to be automatically maintained despite long- and short-term changes in the resistance of the MR head due to wear, aging, temperature fluctuations. It can also automatically compensate for variations in the resistance of MR heads due to tolerances in the manufacturing process. Moreover, the single circuit design 10 can accommodate MR heads with different biasing requirements by appropriate selection or adjustment of $V_1$ and $V_2$.

The output impedance of a p-type-transistor based current source is inherently different from that of an n-type-transistor based current sink due, in part, to the difference in their gains. To provide substantial matching of impedances at the head terminals 14 and 20 in the absence of a grounded center terminal, the current source 22 and sink 26 of the present invention include the resistances 72 and 76, respectively, interconnected between the respective emitters of the transistors 70 and 74 and the voltage terminals 30 and 36. The resistances 72 and 76 also increase the impedances at the terminals 14 and 20 of the head 16 in the frequency range of operation. Input impedance $Z_1(s)$ at the upper terminal 14 of the MR head 20 can be represented as follows:

$$Z_1(s) = \frac{R_{o1}(s)}{1 + A_1(s)\delta(s)R_{o1}(s)}$$

where $A_1(s)$ represents the transfer function of the upper control device 24 configured as an integrator, $\delta(s)$ represents the transconductance of the current source 22, and $R_{o1}(s)$ represents the output impedance of the current source 22. Due to the negative feedback, the input impedance $Z_1(s)$ is small at low frequencies and approaches $R_{o1}(s)$ at high frequencies, thereby having bandpass characteristics. Consequently, the upper terminal 14 can follow a slowly varying signal caused by changes at the output terminal 32 of the current source 22 without being affected by the rapidly varying data signal from the MR head 16. A similar analysis applies to the lower biasing stage 18.

A further benefit of the present invention is achieved by the series configuration of the upper biasing stage 12, the MR head 16 and the lower biasing stage 18. Because each control device 24 and 28 draws only a nominal amount of current, substantially all of the current provided by the current source 22 and sink 26 is used for head biasing. By contrast, only about one-half of the current generated in a traditional parallel biasing circuit is actually used for biasing while the remaining current flows through feedback paths. Consequently, the present invention provides reduced power consumption and associated heat dissipation requirements. Such reductions are particularly advantageous when the MR head 16 and biasing stages 12 and 18 are incorporated into a bank of many MR heads, such as twenty.

While the invention has been particularly shown and described with reference to preferred embodiments thereof, it will be understood by those skilled in the art that various changes in form and details may be made therein without departing from the spirit and scope of the invention.

What is claimed is:

1. A magneto-resistive head apparatus, comprising:
    a) a magneto-resistive head having first and second terminals;
    b) a first op-amp having a non-inverting input interconnected with a first voltage source, an inverting input, and an output;
    c) an adjustable current source having a control terminal interconnected with said output of said first op-amp, a current terminal interconnected with said first terminal of said head, and a voltage terminal interconnected with a second voltage source;
    d) a first capacitance interconnected in parallel with said output of said first op-amp and said inverting input of said first op-amp;
    e) a first resistance interconnected between said inverting input of said first op-amp and said first terminal of said head;
    f) a second op-amp having a non-inverting input interconnected with a third voltage source, an inverting input, and an output;
    g) an adjustable current sink having a control terminal interconnected with said output of said second op-amp, a current terminal interconnected with said second terminal of said head, and a voltage terminal interconnected with a fourth voltage source;
    h) a second capacitance interconnected in parallel with said output of said second op-amp and said inverting input of said second op-amp; and
    i) a second resistance interconnected between said inverting input of said second op-amp and said second terminal of said head;
    wherein said first terminal of said head is substantially maintained at a first predetermined voltage and said second terminal of said head is substantially maintained at a second predetermined voltage.

2. A magneto-resistive head apparatus, as claimed in claim 1, further comprising:
    a) a third resistance interconnected in series with said first capacitance; and
    b) a fourth resistance interconnected in series with said second capacitance.

3. A magneto-resistive head apparatus, as claimed in claim 1, further comprising:
    a) a first inverter interconnected between said output of said first op-amp and said control terminal of said adjustable current source; and
    b) a second inverter interconnected between said output of said second op-amp and said control terminal of said adjustable current sink.

4. A magneto-resistive head apparatus, as claimed in claim 1, wherein:
    a) said adjustable current source comprises:
        i) a p-type transistor having a collector interconnected with said current terminal of said adjustable current source, a base interconnected with said control terminal of said adjustable current source, and an emitter; and
        ii) a fifth resistance interconnected between said emitter of said p-type transistor and said voltage terminal of said adjustable current source; and
    b) said adjustable current sink comprises:
        i) an n-type transistor having a collector interconnected with said current terminal of said adjustable current sink, a base interconnected with said control terminal of said adjustable current sink, and an emitter; and
        ii) a sixth resistance interconnected between said emitter of said n-type transistor and said voltage terminal of said adjustable current sink.

5. An apparatus for biasing a magneto-resistive head, comprising:
    a) an adjustable current source interconnected with a first terminal of a magneto-resistive head;
    b) first control means for detecting a voltage at the first terminal of the head and for adjusting a current provided by said adjustable current source whereby the voltage at the first terminal of the head is substantially maintained at a first predetermined voltage, said first control means comprising a first op-amp for generating a signal representative of the difference between the voltage at the first terminal of the head and the first predetermined voltage, said first op-amp having a non-inverting input interconnected with a first voltage source, an inverting input interconnected with the first terminal of the head, and an output interconnected with a control terminal of said adjustable current source, said first voltage source providing a voltage equal to the first predetermined voltage;

c) an adjustable current sink interconnected with a second terminal of the head; and d) second control means for detecting a voltage at the second terminal of the head and for adjusting a current provided by said current sink whereby the voltage at the second terminal of the head is substantially maintained at a second predetermined voltage.

6. An apparatus, as claimed in claim 5, wherein said first control means further comprises:

a) a first capacitance interconnected in parallel with said output of said first op-amp and an inverting input of said first op-amp; and b) a first resistance interconnected between said inverting input of said first op-amp and said first terminal of said head.

7. An apparatus, as claimed in claim 6, wherein said first control means further comprises a third resistance interconnected in series with said first capacitance.

8. An apparatus, as claimed in claim 6, further comprising a first inverter interconnected between said output of said first op-amp and said control terminal of said adjustable current source.

9. An apparatus, as claimed in claim 5, wherein said second control means comprises a second op-amp for generating a signal representative of the difference between the voltage at the second terminal of the head and the second predetermined voltage.

10. An apparatus, as claimed in claim 9, wherein said second op-amp has a non-inverting input interconnected with a second voltage source, an inverting input interconnected with the second terminal of the head, and an output interconnected with a control terminal of said adjustable current sink, said second voltage source providing a voltage equal to the second predetermined voltage.

11. An apparatus, as claimed in claim 9, wherein said second control means further comprises:

a) a second capacitance interconnected in parallel with said output of said second op-amp and an inverting input of said second op-amp; and b) a second resistance interconnected between said inverting input of said second op-amp and said second terminal of said head.

12. An apparatus, as claimed in claim 11, wherein said second control means further comprises a fourth resistance interconnected in series with said second capacitance.

13. An apparatus, as claimed in claim 11, further comprising a second inverter interconnected between said output of said second op-amp and said control terminal of said adjustable current sink.

14. A magneto-resistive head apparatus, comprising:

a) a magneto-resistive head having first and second terminals;

b) a first biasing section, interconnected in series with said magneto-resistive head, for substantially maintaining said first terminal of said head at a first fixed predetermined voltage; and c) a second biasing section, interconnected in series with said magneto-resistive head and said first biasing section, for substantially maintaining said second fixed terminal of said head at a second predetermined voltage;

wherein, in operation, said magneto-resistive head is biased at a voltage substantially equal to the difference between the first and second predetermined voltages.

15. An apparatus, as claimed in claim 14, wherein said first biasing section comprises:

a) an adjustable current source interconnected with the first terminal of the magneto-resistive head; and b) first control means for detecting a voltage at the first terminal of the head and for adjusting a current provided by said adjustable current source to substantially maintain the voltage at the first terminal of the head at the first fixed predetermined voltage.

16. An apparatus, as claimed in claim 15, wherein said first control means comprises a first op-amp for generating a first difference signal representative of the difference between the voltage at the first terminal of the head and the first fixed predetermined voltage.

17. An apparatus, as claimed in claim 16, wherein said first control means further comprises:

a) a first capacitance interconnected in series with a first resistance, said first capacitance and said first resistance being interconnected in parallel with an output of said first op-amp and an inverting input of said first op-amp; and b) a second resistance interconnected between said inverting input of said first op-amp and said first terminal of said head.

18. An apparatus, as claimed in claim 15, wherein said second biasing section comprises:

a) an adjustable current sink interconnected with the second terminal of the magneto-resistive head; and b) second control means for detecting a voltage at the second terminal of the head and for adjusting a current provided by said adjustable current sink to substantially maintain the voltage at the second terminal of the head at the second fixed predetermined voltage.

19. An apparatus, as claimed in claim 18, wherein said second control means comprises a second op-amp for generating a second difference signal representative of the difference between the voltage at the second terminal of the head and the second fixed predetermined voltage.

20. An apparatus, as claimed in claim 19, wherein said second control means further comprises:

a) a second capacitance interconnected in series with a third resistance, said second capacitance and said third resistance being interconnected in parallel with an output of said second op-amp and an inverting input of said second op-amp; and b) a fourth resistance interconnected between said inverting input of said second op-amp and said second terminal of said head.

21. A method for maintaining a predetermined DC potential across a magneto-resistive head, comprising the steps of:

a) comparing a first operating voltage, at a first terminal of a magneto-resistive head, with a first fixed reference voltage;

b) adjusting a current provided by an adjustable current source interconnected with a first terminal of the head until the first operating voltage is substantially equal to the first fixed reference voltage, wherein a predetermined DC potential across the head is established substantially equal to the difference between the first and second reference voltages;

c) comparing a second operating voltage, at a second terminal of the head, with a second fixed reference voltage; and d) adjusting a current provided by an adjustable current sink interconnected with a second terminal of the head until the second operating voltage is substantially equal to the second fixed reference voltage.

22. A method, as claimed in claim 21, wherein said first comparing step comprises the step of generating a first difference signal representative of the difference between the first fixed operating voltage and the first reference signal.

23. A method, as claimed in claim 22, wherein said first adjusting step comprises the step of adjusting the current provided by the adjustable current source by an amount proportional to the magnitude of the first difference signal.

24. A method, as claimed in claim 21, wherein said second comparing step comprises the step of generating a second difference signal representative of the difference between the second fixed operating voltage and the second reference signal.

25. A method, as claimed in claim 24, wherein said second adjusting step comprises the step of adjusting the current provided by the adjustable current sink by an amount proportional to the magnitude of the second difference signal.

* * * * *